(12) United States Patent
Niu et al.

(10) Patent No.: US 7,446,398 B2
(45) Date of Patent: Nov. 4, 2008

(54) BUMP PATTERN DESIGN FOR FLIP CHIP SEMICONDUCTOR PACKAGE

(75) Inventors: Pao-Kang Niu, Hsinchu (TW); Pei-Haw Tsao, Tai-chung (TW); Hao-Yi Tsai, Hsinchu (TW); Yung-Kuan Hsiao, Chu-bei (TW); Chung Yu Wang, Hsin Chu (TW); Shang-Yun Hou, Jubei (TW); Lin Yu-Ting, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 128 days.

(21) Appl. No.: 11/461,663

(22) Filed: Aug. 1, 2006

(65) Prior Publication Data

US 2008/0029876 A1 Feb. 7, 2008

(51) Int. Cl.
*H01L 23/48* (2006.01)
*H01L 23/488* (2006.01)
*H01L 23/498* (2006.01)

(52) U.S. Cl. .................. 257/668; 257/E23.01; 257/690; 257/737; 257/693; 257/774; 361/755; 361/783; 361/777; 361/754; 324/754; 324/760; 324/755

(58) Field of Classification Search ................ 257/668, 257/E23.01, 690, 691, 692, 693, 59, 72, 734, 257/737, 738, 778, 773, 780, 786; 361/403, 361/783, 777, 754, 755, 756, 757, 758, 759, 361/760; 324/754, 760, 755

See application file for complete search history.

(56) References Cited

U.S. PATENT DOCUMENTS

| | | | | |
|---|---|---|---|---|
| 4,600,970 A | * | 7/1986 | Bauer | 361/768 |
| 6,204,089 B1 | | 3/2001 | Wang | |
| 6,285,560 B1 | * | 9/2001 | Lyne | 361/760 |
| 6,888,360 B1 | * | 5/2005 | Connell et al. | 324/754 |
| 6,919,227 B2 | * | 7/2005 | Nishiyama | 438/109 |
| 6,952,050 B2 | | 10/2005 | Kwon et al. | |
| 6,958,537 B2 | | 10/2005 | Eng et al. | |
| 7,224,424 B2 | * | 5/2007 | Hwang et al. | 349/152 |
| 2006/0017175 A1 | * | 1/2006 | Akram et al. | 257/780 |
| 2006/0065965 A1 | * | 3/2006 | Ohsaka | 257/690 |

OTHER PUBLICATIONS

Amkor Technology, Enabling Technologies, "Flip Chip Packaging Technology Solution" at http://www.amkor.com/enablingtechnologies/FlipChip/index.cfm, Jul. 12, 2006, 8 pages.

* cited by examiner

*Primary Examiner*—Alexander O Williams
(74) *Attorney, Agent, or Firm*—Duane Morris LLP

(57) ABSTRACT

A bump pattern design for flip chip semiconductor packages includes a pattern of contact pads formed on a package substrate. Each contact pad is adapted to receive a corresponding solder bump from a semiconductor chip attached thereto. The pattern includes a central portion and a peripheral portion with a transition portion therebetween. The transition portion has a lower pattern density than the central portion and peripheral portions. In the peripheral portion is at least one outer portion having a pattern density less than the average pattern density of the central portion. The outer portions of reduced pattern density may be the corner sections in a rectangular bump pattern and may further include channels that are void of contact pads. The peripheral portion may include an average pitch between most of the rows and columns, but also an increased pitch between some adjacent rows and columns.

18 Claims, 2 Drawing Sheets

BUMP PATTERN DESIGN FOR FLIP CHIP SEMICONDUCTOR PACKAGE

FIELD OF THE INVENTION

The present invention relates, most generally, to semiconductor packaging. More particularly, the invention relates to an improved bump pattern for flip chip packaging.

BACKGROUND

Semiconductor dice (also referred to as chips/dice herein) are found in many electronic products today. As semiconductor dice get smaller and more complex, the problem of making electrical connections between semiconductor dice and carrier substrates such as printed circuit boards or intermediate substrates, has been addressed with a variety of constantly evolving solutions.

One of the earlier solutions included wire bonding from signal connection devices such as bond pads, of a semiconductor die, to pins or leads of a lead frame contained in a ceramic or plastic package. Finished packages were mounted to a carrier substrate such as a printed circuit board, where the pins or leads made electrical connection with contact structures of the carrier substrate.

The use of wires for connecting a semiconductor die to a substrate and the wire bonding processes in particular, are problematic. Problems include, for example: tight size and pitch (spacing) requirements for the bond pads of the semiconductor die and contact pads of the substrate; inductance in the signals due to the long curved wires; wire bond breakage and wire sweep causing shorting between adjacent wires; and, high signal frequency semiconductor dice making the wire bonding process difficult and expensive. These problems became more pronounced as levels of integration increase and as each semiconductor die is manufactured to include increasingly more signal connection devices, such as bond pads and the like.

Flip-chip technologies using solder balls or bumps have helped to alleviate some of these problems. In flip-chip packaging, instead of wire bonding, conductive bumps such as balls of solder, may be formed at the locations of the bond pads of a semiconductor die. A lead frame with a package substrate having contact pads corresponding to the bumps, is also formed. Alternatively, other carrier substrates such as a printed wiring board may have electrical connection locations such as terminals which correspond to the placement of the solder balls on the bond pads of the semiconductor die. In assembly, the semiconductor die is "flipped" upside down so the solder balls are placed, for example, on the corresponding contact pads of the package substrate.

This packaging solution alleviates at least some of the inductance problems, allowing for higher frequency performance and better signal integrity of the semiconductor die. Also, to a certain extent, it allows the contact pads of a substrate to be larger, more widely pitched and placed anywhere on the semiconductor die active surface rather than just around the periphery or down the center thereof.

The assembly process consists of joining the solder bumps of the die to the contact pads on the package substrate. A solder reflow process heats the solder balls until the solder begins to flow and bond with the corresponding contact pad. Prior to being joined and heated, a flux is applied to at least one of the surfaces to be joined to assist in the solder/reflow processes by isolating the surface from the atmosphere and providing an adhesive force to hold the die to the substrate during the process. Upon cooling, the solder forms both mechanical and electrical connections between the carrier substrate and the semiconductor die and the flux must then be removed by a subsequent cleaning procedure. For example, a wash and bake cycle may be used to remove the flux.

An epoxy under-fill is applied between the active surface of the chip and the facing surface of the substrate to surround and support the solder interconnects. Under-filling significantly increases the reliability and fatigue resistance of the package interconnections. The under-fill helps to more evenly distribute stress caused by thermally induced strains due to the differences in coefficients of thermal expansion (CTE) between the chip and substrate, across the entire surface of the chip and substrate. If the gap between the interconnected die and substrate were not under-filled, the stress would be carried by the relatively thin solder interconnects, often resulting in premature package failure. However, in order for the under-fill to perform properly, it must be well adhered to the die and substrate surfaces. Even a thin film of flux residue can cause premature delamination of a bonded surface, eventually resulting in failure in one or more of the interconnects. Accordingly, it is critical to completely remove all flux residues from the package. This has become even more challenging as the thickness of the gap between the die and the substrate has decreased.

Moreover, semiconductor die now have increased numbers of bond pads formed in closer proximity as integration levels increase. As a result, there are more bumps formed in close proximity on the semiconductor die. Since the bump pitch is becoming increasingly smaller, the assembly process becomes more difficult and creates more reliability issues such as the aforementioned incomplete flux cleaning. In addition to causing delamination of the underfill around the bump region, flux residue can cause shorting between respective bumps and other reliability issues and therefore the removal of the residual flux is especially critical. It would be desirable to provide a bump pattern that accommodates the high density demands of the advancing semiconductor manufacturing industry and alleviates reliability problems such as associated with residual flux in an efficient and cost-effective manner.

SUMMARY OF THE INVENTION

To address these and other needs, and in view of its purposes, the invention provides a semiconductor package comprising a package substrate with a surface for receiving a semiconductor chip joined in confronting relation thereto. The surface includes a pattern of contact pads thereon, each contact pad capable of receiving a corresponding solder bump of the semiconductor chip joined thereto. The pattern comprises a central portion, a peripheral portion surrounding the central portion and a transition portion therebetween, the transition portion having a lower pattern density than the central portion and the peripheral portion.

According to another aspect, provided is a semiconductor package comprising a package substrate with a surface for receiving a semiconductor chip joined in confronting relation thereto, the surface including a pattern of contact pads thereon. Each contact pad is capable of receiving a solder bump of the corresponding semiconductor chip joined thereto, the pattern including a central portion and a peripheral portion. The peripheral portion includes a low density portion having a lower pattern density than the central portion.

According to another aspect, provided is a semiconductor package comprising a package substrate with a surface for receiving a semiconductor chip joined in confronting relation thereto, the surface including a pattern of contact pads thereon. Each contact pad is capable of receiving a corresponding solder bump of the semiconductor chip joined thereto. The pattern is rectangular and includes at least one channel void of the contact pads extending in each corner of the rectangle.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1A:
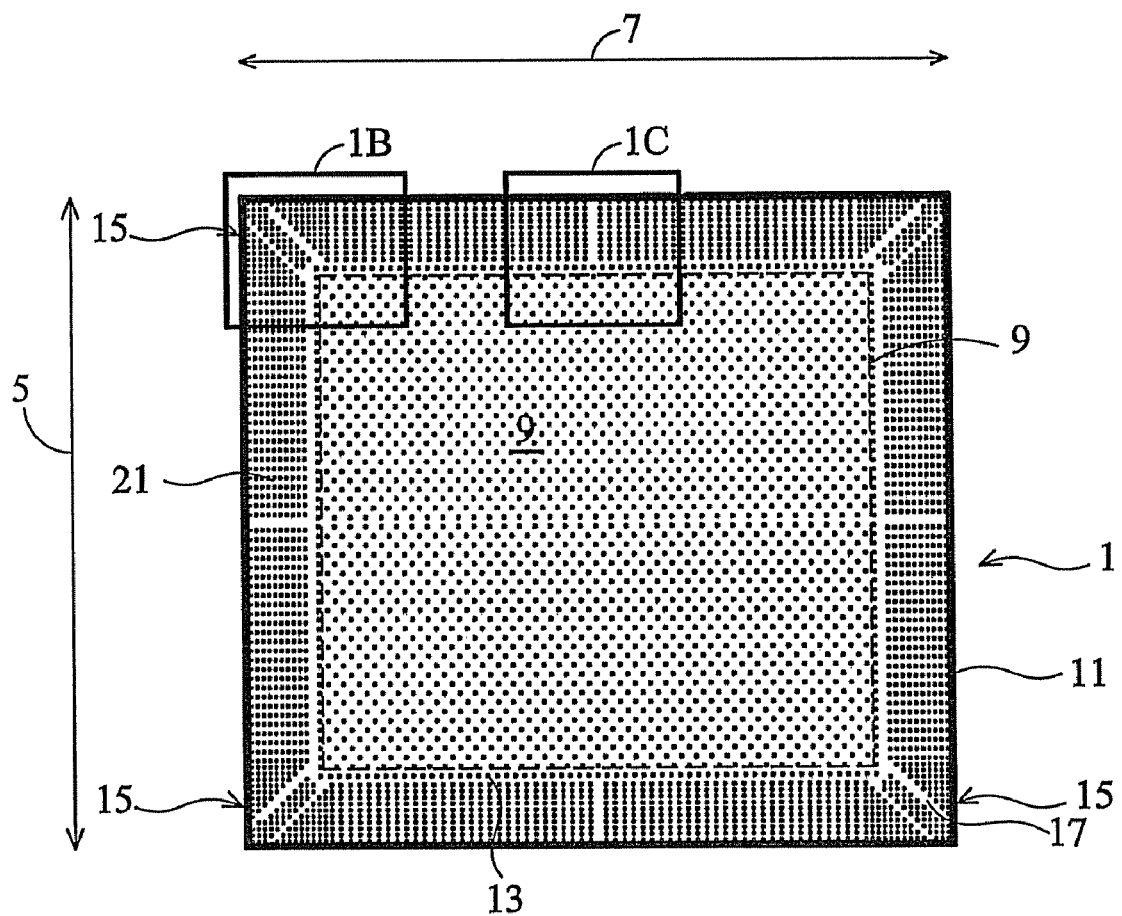
FIG. 1A is a plan view of an exemplary bump pattern according to the invention and FIGS. 1B and 1C are enlarged portions of the pattern shown in FIG. 1A and as illustrated.

The invention provides a bump pattern that may be formed on a semiconductor package substrate for use in conjunction with a semiconductor chip using flip chip packaging technology. The pattern formed on the semiconductor package substrate includes a plurality of conductive bumps, each one adapted to receive a corresponding solder bump formed on a semiconductor chip mounted in confronting relationship with the semiconductor package substrate. In some embodiments, each contact pad will receive a solder bump joined thereto and in other exemplary embodiments only a percentage of the contact pads will receive a solder bump from a corresponding semiconductor chip attached thereto. In this case, there are excess contact pads not joined to a solder bump of the semiconductor chip.

The semiconductor chip may be mounted to the bump pattern of contact pads formed on the semiconductor package substrate using conventional flip-chip packaging technologies as available in the art. A typical processing sequence includes forming solder bumps on bond pads or other signal connection devices formed on a semiconductor chip, applying flux to at least one of the package substrate with the contact pads, and the semiconductor chip with the solder bumps, and aligning the chip to the package substrate. The members are then joined during a reflow process. A typical reflow process is a thermal process with a ramp-up and ramp-down portion with a total time that may vary from 2 to 10 minutes and may stay at a maximum temperature within the range of 200-260° C. for a time of 1 to 4 minutes but such parameters are exemplary only. After the re-flow process, a deflux or cleaning process is used to remove the flux from the package and/or chip. After the flux is cleaned, an underfill material is applied between the chip and package substrate to evenly distribute the stress mechanically formed between the package substrate and the semiconductor die. The bump pattern of the present invention provides the advantage that the flux cleaning process is more efficient and therefore, complete. Flux clean loading is reduced. Due to the more efficient flux cleaning, delamination of the underfill around the solder bumps is reduced increasing the overall reliability of the flip chip bonding process.

These advantages are realized due to the configuration of the bump contact pad pattern formed on the package substrate. Critical regions of the contact pad pattern are identified and the invention provides a contact pad pattern with one or more of the following characteristics: a channel void of contact pads; rows of contact pads in an outer section being staggered with respect to rows of contact pads in an inner section; portions of the pattern intermittently include a wider pitch than other proximate portions of the pattern; and the corners of the pattern including a channel or other low pattern density section. It should be understood that the aforementioned characteristics are exemplary and the contact pad pattern of the invention is not intended to be limited to these exemplary embodiments.

FIG. 1A is a plan view of an exemplary contact pad pattern 1 as may be formed on a package substrate for a semiconductor package. Pattern 1 is made up of a plurality of individual contact pads 3 that are shown more clearly in FIGS. 1B and 1C. Pattern 1 is an orthogon or rectangle and in the illustrated embodiment is generally a square. Length 5 and width 7 of pattern 1 may take on various values in various exemplary embodiments, according to application and design. Pattern 1 includes central portion 9 and outer portion 11 with transition portion 13 therebetween. Transition portion 13 includes a pattern density less than an average pattern density of contact pads in central portion 9 and in outer portion 11. Alternatively, transition portion 13 may be considered to include a plurality of channels void of contact pads and disposed between central portion 9 and outer portion 11. In other exemplary embodiments, transition portion 13 may include a more pronounced gap, i.e., may be a wider channel void of contact pads. Transition portion 13 may include one or more rows 14 of contact pads and the pitch between rows or the distance between the row(s) and the adjacent central portion 9 and outer portion 11 will be larger than the pitch in outer portion 11.

Figure 1B:
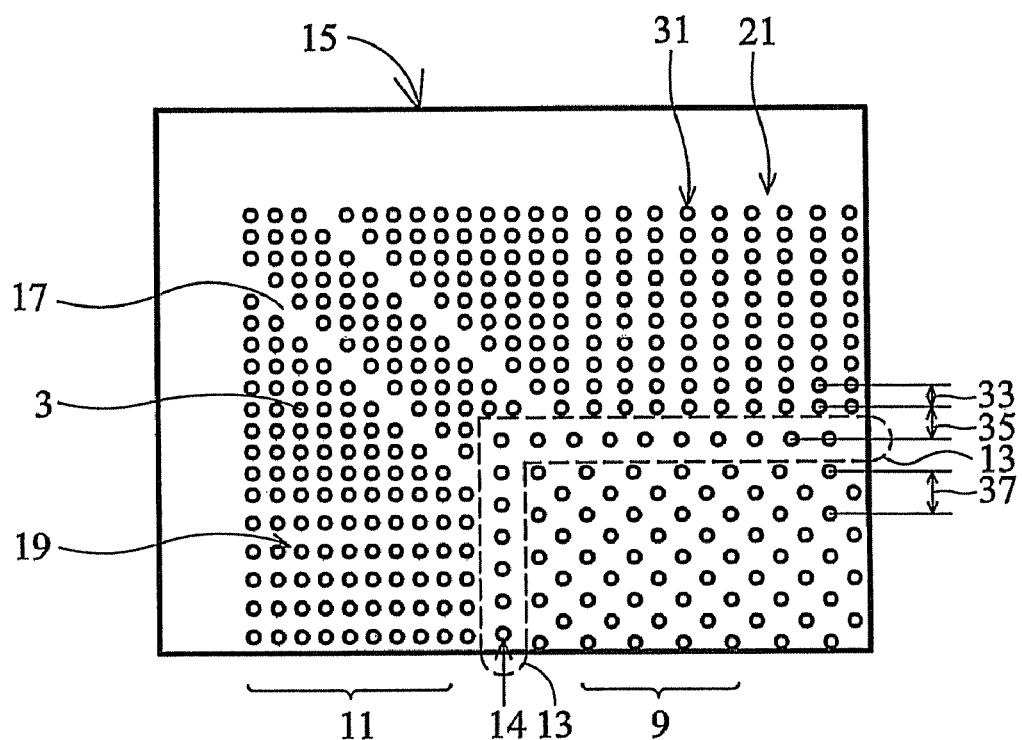
Figure 1C:
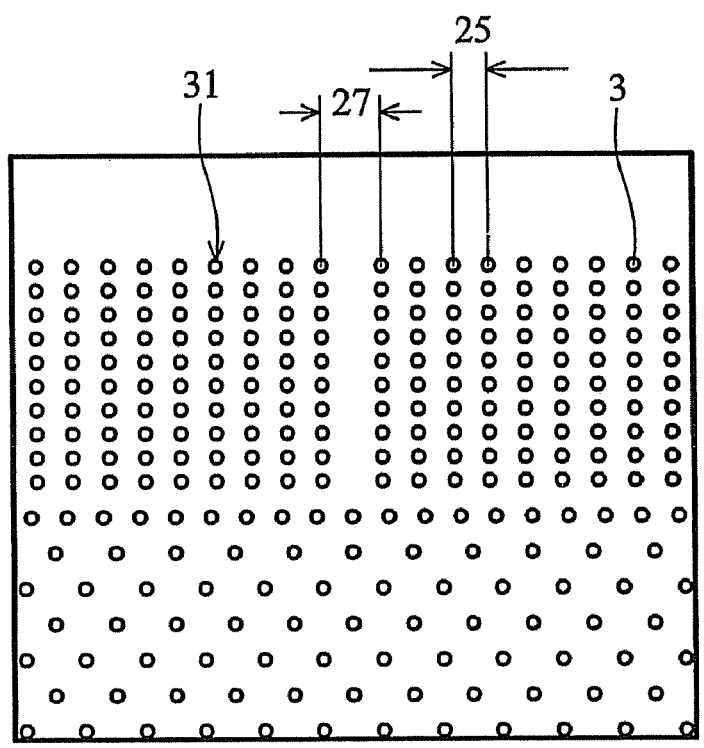

Outer portion 11 includes various peripheral portions such as corner sections 15 that have a lower pattern density than an average pattern density of central portion 9. Outer portion 11 consists of contact pads 3 arranged in rows 19. As shown more clearly in FIG. 1B, corner section 15 may include diagonal channels 17 that are void of contact pads 3. Alternatively stated, adjacent contact pads 3 are spaced apart by a further distance across diagonal channel 17, than they are between rows 19 within corner section 15 and form a local peripheral portion with a low pattern density. In other embodiments, a channel void of contact pads 3 may be formed perpendicular to the illustrated direction of diagonal channel 17, or at another acute angle in corner sections 15. Edge sections 21 extend between corner sections 15 within outer portion 11 of pattern 1. As shown in FIG. 1C, many of rows 19 may be spaced by an average pitch 25 and some adjacent rows may be spaced apart by a larger pitch 27 within outer portion 11. In one exemplary embodiment, pitch 25 may range from 100-250 microns and pitch 27 may range from 200-400 microns. In one exemplary embodiment, pitch 25 may be 250 microns and pitch 27 300 microns but other relative pitches may be used in other exemplary embodiments. The wider pitch 27 may be used intermittently between rows 19 in outer portion 11. FIGS. 1B and 1C also show that columns 31 of contact pads 3 within outer portion 11 are staggered with respect to the columns of contact pads 3 within central portion 9 and the contact pads 3 within transition portion 13. Within central portion 9, it can be seen that contact pads 3 are arranged in diagonal rows or considered to be arranged in parallel rows but in alternating columns but other arrangements may be used alternatively. Columns 31 are seen to be generally parallel to the edges of rectangle pattern 1.

In one exemplary embodiment, rows 19 and columns 31 of edge sections 21 may be symmetrical about the diagonal, i.e., the contact pad pattern within edge section 21 that extends along the top of pattern 1 may be the same as the contact pad arrangement within the edge section 21 that extends along the side of pattern 1. In other exemplary embodiments, the arrangement within the edge section 21 that extends along the top may be different than the arrangement within the edge section 21 that extends along the side of pattern 1. Similarly, opposed edge sections 21 (along the top and bottom, for example) may be the same or differ.

FIG. 1B shows more detail of the difference in pattern density between central portion 9, outer portion 11 and transition portion 13. Pitch 33 between adjacent contact pads 3 of adjacent rows 19 in outer portion 11, may be 150 microns in one embodiment, with pitch 35 between the row of contact pads 3 within transition portion 13 and the adjacent row of contact pads 3 within outer portion 11 being advantageously between 150 and 300 microns, and 225 microns in one exemplary embodiment. Pitch 37 between adjacent rows 19 with contact pads in alternating positions may be on the order of 300 microns as in the illustrated embodiment. These dimensions are intended to be exemplary only, and in other exemplary embodiments, other dimensions may be used. For example pitch 35 may be much greater to produce a large channel between outer portion 11 and central portion 9. Moreover, transition portion 13 may include multiple rows spaced apart by pitch 35. Returning to FIG. 1A, central portion 9 also includes varying pattern densities. Some areas within central portion 9 may include lower pattern densities than other portions within the central portion 9.

The illustrated pattern is exemplary, and not limiting of the bump pattern of the present invention. Other variations may be used. It is an aspect of the bump pattern of the invention that in rectangular patterns as favored in the semiconductor packaging industry, the corners of the pattern may include a reduced pattern density relative to other portions of the pattern. In other exemplary embodiments, other peripheral portions of outer portion 11 may include local areas of reduced pattern density, i.e., having a pattern density lower than the pattern density in other areas of the outer portion 11, and/or lower than the average pattern density in the inner portion 9. Another aspect of the invention are channels which may be diagonal channels such as diagonal channel 17 shown in FIG. 1B, or other diagonal features void of contact pads, that produces a localized region of low pattern density in corners. In other exemplary embodiments, a channel or other pattern regions void of contact pads, may be formed in corners. According to another aspect, the transition area having a different pitch than the inner and outer portions 9 and 11, may be relatively larger than shown in FIG. 1A, for example it may include more rows spaced by the higher pitch. According to another aspect, in which the rows/columns within inner portion 9 are staggered with respect to the rows/columns in outer portion 11, and/or with respect to the rows of contact pads in transition portion 13. The staggered rows of the inner 9 and outer 11 portions may have the same or a different pitch and various different arrangements may be used.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor package comprising a package substrate with a surface for receiving a semiconductor chip joined in confronting relation thereto, said surface including a pattern of contact pads thereon, each contact pad capable of receiving a corresponding solder bump of said semiconductor chip joined thereto, said pattern comprising a central portion, a peripheral portion surrounding said central portion and a transition portion therebetween, said transition portion having a lower pattern density than said central portion and said peripheral portion, wherein said transition portion comprises at least one row of said contact pads.

2. The semiconductor package as in claim 1, wherein said transition portion comprises at least one channel void of said contact pads.

3. The semiconductor package as in claim 1, wherein said peripheral portion includes peripheral rows of said contact pads, said central portion includes central rows of said contact pads, and at least a first row of said at least one row of said contact pads of said transition portion, is staggered with respect to said peripheral rows and said central rows.

4. The semiconductor package as in claim 1, wherein said peripheral portion includes at least a section with a lower pattern density than an average pattern density of said central portion.

5. The semiconductor package as in claim 1, wherein said pattern is rectangular and said peripheral portion includes corner sections and edge sections extending between said corner sections, each said corner section including a plurality of channels void of contact pads and each said edge section including a single channel void of contact pads, each channel comprising a spacing between adjacent rows of contact pads that is greater than an average pitch between rows of contact pads.

6. The semiconductor package as in claim 1, wherein said pattern is rectangular and said peripheral portion includes corner sections and edge sections extending between said corner sections, said contact pads are arranged in a plurality of rows in said peripheral portion, and said edge section includes a first pitch between a majority of said plurality of rows and a second pitch being greater than said first pitch intermittently between some adjacent rows of said plurality of rows.

7. The semiconductor package as in claim , wherein said pattern comprises a rectangle, said peripheral portion comprises rows of said contact pads parallel to sides of said rectangle and there is at least one channel void of said contact pads extending diagonally in corners of said rectangle such that spacing between adjacent contact pads is greater across said channel than between said rows.

8. The semiconductor package as in claim 1, wherein said contact pads of said at least one row of said contact pads in said transition portion are staggered with respect to said contact pads of second rows of said contact pads in said peripheral portion.

9. The semiconductor package as in claim 8, wherein at least a first row of said at least one row of said contact pads in said transition portion is parallel to said second rows and said contact pads within said first row have the same pitch as said contact pads within said second rows.

10. The semiconductor package as in claim 8, wherein said transition portion comprises a plurality of said first rows, said first and second rows are parallel and a first pitch between said first rows is greater than a second pitch between said second rows.

11. A semiconductor package comprising a package substrate with a surface for receiving a semiconductor chip joined in confronting relation thereto, said surface including a pattern of contact pads thereon, each contact pad capable of receiving a solder bump of said corresponding semiconductor chip joined thereto, said pattern including a central portion and a peripheral portion, said peripheral portion including a low density section having a lower pattern density than said central portion, wherein said contact pads are arranged in a plurality of rows in said peripheral portion and said peripheral portion includes a first pitch between a majority of said plurality of rows and said low density section comprises a channel producing a second pitch being greater than said first pitch intermittently between adjacent rows of said plurality of rows.

12. The semiconductor package as in claim 11, wherein said pattern is rectangular and said low density section is formed within corners of said rectangle.

13. The semiconductor package as in claim 11, wherein said pattern comprises a rectangle, said peripheral portion comprises rows of said contact pads parallel to sides of said rectangle and there is at least one channel void of said contact pads extending diagonally in corners of said rectangle such that spacing between adjacent contact pads is greater across said channel than between said rows.

14. The semiconductor package as in claim 11, further comprising a transition portion disposed between said peripheral portion and said central portion, said transition portion including a lower pattern density of said contact pads than said central portion and said peripheral portion.

15. The semiconductor package as in claim 11, wherein a channel void of said contact pads is disposed between said peripheral portion and said central portion.

16. A semiconductor package comprising a package substrate with a surface for receiving a semiconductor chip joined in confronting relation thereto, said surface including a pattern of contact pads thereon, each contact pad capable of receiving a corresponding solder bump of said semiconductor chip joined thereto, said pattern forming a rectangle and including at least one channel void of said contact pads extending in each corner of said rectangle such that spacing between adjacent ones of said contact pads in a row of said contact pads is greater across said channel than between other ones of said adjacent contact pads in said row of said contact pads in said corner.

17. The semiconductor package as in claim 16, wherein said pattern includes a central portion and a peripheral portion, said peripheral portion having parallel first rows of said contact pads parallel to sides of said rectangle and said channel extends diagonally.

18. The semiconductor package as in claim 16, wherein said pattern includes a central portion with central rows and a peripheral portion with peripheral rows parallel to and staggered with respect to, said central rows.

\* \* \* \* \*

UNITED STATES PATENT AND TRADEMARK OFFICE
CERTIFICATE OF CORRECTION

| | | |
|---|---|---|
| PATENT NO. | : 7,446,398 B2 | Page 1 of 1 |
| APPLICATION NO. | : 11/461663 | |
| DATED | : November 4, 2008 | |
| INVENTOR(S) | : Pao-Kang Niu et al. | |

It is certified that error appears in the above-identified patent and that said Letters Patent is hereby corrected as shown below:

Column 7, line 6, replace "claim" with --claim 1--

Signed and Sealed this

Twenty-eighth Day of April, 2009

JOHN DOLL
*Acting Director of the United States Patent and Trademark Office*